(12) United States Patent
Anderson (10) Patent No.: US 7,034,548 B2
(45) Date of Patent: Apr. 25, 2006

(54) BALANCED DEVICE CHARACTERIZATION INCLUDING TEST SYSTEM CALIBRATION

(75) Inventor: Keith F. Anderson, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 18 days.

(21) Appl. No.: 10/411,806

(22) Filed: Apr. 11, 2003

(65) Prior Publication Data

US 2004/0201383 A1   Oct. 14, 2004

(51) Int. Cl.
G01R 27/00    (2006.01)

(52) U.S. Cl. ........................... 324/600; 324/650

(58) Field of Classification Search ........ 324/637–646, 324/650–651; 702/57, 117
See application file for complete search history.

(56) References Cited

U.S. PATENT DOCUMENTS

| | | | |
|---|---|---|---|
| 5,047,725 A * | 9/1991 | Strid et al. ................... | 324/601 |
| 5,495,173 A | 2/1996 | Bockelman et al. | |
| 5,793,213 A | 8/1998 | Bockelman et al. | |
| 6,249,128 B1 * | 6/2001 | Begg ......................... | 324/601 |
| 6,472,885 B1 * | 10/2002 | Green et al. ................ | 324/638 |
| 6,614,237 B1 * | 9/2003 | Ademian et al. ........... | 324/601 |
| 6,665,628 B1 * | 12/2003 | Martens ...................... | 702/117 |
| 6,711,723 B1 * | 3/2004 | Tsai et al. ...................... | 716/4 |
| 6,757,625 B1 * | 6/2004 | Adamian et al. ............. | 702/57 |

OTHER PUBLICATIONS

Advanced tes 4-Port 10MHz to 3, 6, or 9Ghz Vecto Network Analyzer.*
"Understanding Mixed- Mode S-Parameters", Application Note 9902C, A TN Microwave, Inc.

(Continued)

Primary Examiner—Vincent Q. Nguyen (57) ABSTRACT

A test system and method characterize a balanced device under test (DUT) with a vector network analyzer (VNA) measurement system using a differential or balanced stimulus signal and further calibrate the VNA using conventional calibration standards. An effect of errors introduced by an uncalibrated portion of the measurement system, such as test fixturing and hybrid junction coupling, is de-embedded from measured S-parameters for the DUT. The method includes calibrating the VNA, characterizing the uncalibrated portion, measuring S-parameters for the DUT with the calibrated VNA, and de-embedding the uncalibrated portion characterization from the S-parameter measurements. The test system includes a multiport VNA measurement system that includes a hybrid coupler, an optional test fixture, and a computer program. A processor executes the computer program. Instructions of the computer program implement the method.

30 Claims, 5 Drawing Sheets

OTHER PUBLICATIONS

David E. Bockelman and William R. Eisenstadt,"Calibration and Verification of the Pure-Mode Vector Network Analyzer," IEEE Trans. on Microwave Theory and Techniques, vol. 46, No. 7, Jul. 1998, pp. 1009-1012.

David E. Bockelman, William R. Eisenstadt, and Robert Stengel, "Accuracy Estimation of Mixed-Mode Scattering Parameter Measurements," IEEE Trans. on Microwave Theory and Techniques, vol. 47, No. 1, Jul. 1999, pp. 102-105.

5988-2186EN, "Agilent Measurement Solutions for Balanced Components—Product Overview", Apr. 4, 2001, Agilent Technologies, Inc., pp. 1-12.

5988-2416EN, "Agilent Test Solutions for Multiport and Balanced Devices", May 11, 2001, Agilent Technologies, Inc., pp. 1-8.

5988-5635EN, "Multiport & Balanced Decive Measurement Application Note Series—Concepts in Balanced Device Measurements", Application Note 1373-2, Mar. 8, 2002, Agilent Technologies, Inc., pp. 1-12.

5988-5634EN, "Multiport and Balanced Device Measurement Application Note Series—An Introduction to Multiport and Balanced Device Measurments", Application Note 1373-1, Nov. 11, 2002, Agilent Technologies, Inc., pp. 1-12.

* cited by examiner

BALANCED DEVICE CHARACTERIZATION INCLUDING TEST SYSTEM CALIBRATION

TECHNICAL FIELD

The invention relates to test and measurement equipment. In particular, the present invention relates to measuring balanced devices using a vector network analyzer.

BACKGROUND ART

Balanced devices operating at high frequencies including, but not limited to, microwave frequencies are becoming more and more prevalent in modem systems, especially communication systems. Concomitant with the use of such devices comes a need to measure a performance of the devices. As with single-ended (i.e., non-balanced) microwave devices, balanced microwave devices may be characterized using S-parameters. However, in the case of balanced devices, so-called 'mixed mode' S-parameters are generally used to characterize the device instead of the more conventional or single-ended S-parameters. Mixed mode S-parameters relate differential and common mode signals applied to ports of the balanced device to differential and common mode responses at the ports.

A multiport vector network analyzer (VNA) may be used to measure S-parameters of a multiport device. Since a balanced device may be viewed as a generalized multiport device, conceptually a multiport VNA may be used to measure the S-parameters of a balanced device. Unfortunately, most conventional multiport VNAs measure multiport devices having single-ended (i.e., non-differential) ports. That is, the multiport VNA applies a single-ended signal to a port of a device under test (DUT) and a single-ended response is measured at each of the ports of the DUT by the VNA. Once measured, the measured single-ended S-parameters are converted into mixed mode S-parameters for the balanced device using modal decomposition. Unfortunately, many balanced devices behave differently in response to a single-ended stimulus signal such as those generated by a conventional multiport VNA than to a true differential stimulus signal. Therefore, the single ended S-parameters measured by the conventional VNA may not accurately reflect a performance of the balanced device in the presence of a differential stimulus signal. In a worst case, the balanced device may even fail to operate (e.g., become unstable resulting in unwanted oscillations) or be damaged when presented with a single-ended stimulus signal.

To overcome the limitations of conventional multiport VNAs with respect to balanced device measurement, specialized VNA systems that produce and directly measure balanced signals have been proposed and even constructed. However, such specialized VNA systems either omit portions of the system during a calibration or employ specialized calibration standards and methods. Omitting portions of the system during calibration may lead to errors that are unacceptably high for many practical applications. Specialized calibrations standards may be difficult to construct and/or characterize with sufficient accuracy to support an acceptable level of calibration. Moreover, using specialized VNA systems with or without specialized calibration standards for measuring a balanced device often may be prohibitively expensive.

Accordingly, it would be advantageous to be able to measure a balanced device under test (DUT) with a true differential stimulus signal while still using a conventional single-ended multiport vector network analyzer. Moreover, it would be advantageous if a calibration associated with such balanced DUT measurement accounted for all error sources including any devices and/or test fixtures between the VNA and the DUT while still employing conventional calibration standards and methods. Such a way of producing calibrated measurements of a balanced DUT would address a long-standing need in the area of balanced device measurement at microwave frequencies.

SUMMARY OF THE INVENTION

The present invention facilitates measurement of mixed mode S-parameters of balanced devices at high frequencies including, but not limited to, microwave frequencies. The present invention drives a device under test (DUT) with a balanced or differential signal and employs a conventional multiport vector network analyzer (VNA) and conventional calibration standards for VNA calibration. A measurement error introduced by an uncalibrated portion of a multiport VNA measurement system, such as for example including the use of a hybrid junction coupler and any test fixturing, beyond a calibration reference plane of the multiport VNA is de-embedded from S-parameters measured for the DUT by the present invention. Single-ended measurements thus generated may be converted into mixed mode or differential S-parameters using modal decomposition according to the present invention.

In one aspect of the invention, a method of balanced device characterization using a multiport VNA measurement system is provided. The method comprises measuring mixed mode S-parameters of a balanced device under test (DUT) by de-embedding an uncalibrated portion of the VNA measurement system from S-parameter measurements of the balanced DUT. The uncalibrated portion of the VNA measurement system comprises a hybrid junction coupler or other device that produces a balanced signal used to drive the balanced DUT, and an optional test fixture used to connect the balanced DUT to the VNA measurement system.

In another aspect of the present invention, a test system for balanced device characterization is provided. The test system comprises a multiport VNA measurement system that comprises a calibrated portion including a multiport VNA, and an uncalibrated portion that produces a balanced signal. The multiport VNA measures S-parameters of a balanced device under test (DUT) using the balanced signal. The test system further comprises a computer program executed by the test system, wherein instructions of computer program implement using de-embedded measured S-parameters of the balanced DUT to characterize the balanced DUT, the de-embedded measured S-parameters being measured S-parameters that are corrected for errors introduced by the uncalibrated portion.

In some embodiments, the instructions of the computer program implement calibrating the multiport VNA, and characterizing the uncalibrated portion. The uncalibrated portion comprises a hybrid junction coupler to produce the balanced signal, and an optional test fixture. The instructions further implement measuring S-parameters of the balanced device with the calibrated multiport VNA, de-embedding the uncalibrated portion characterization from the S-parameter measurements, such that the de-embedded measured S-parameter of the balanced DUT result. In some embodiments, a processor of the multiport VNA executes the computer program while in other embodiments an auxiliary computer processor external to the multiport VNA such as, but not limited to, a personal computer, executes the computer program.

The present invention advantageously drives the balanced DUT using a true differential signal during device characterization. Moreover, the VNA measurement system is error corrected to an input measurement reference plane and an output measurement reference plane of the balanced DUT, according to the present invention. Such a system-to-balanced DUT reference planes error conveniently employs conventional multiport calibration standards and a conventional single-ended multiport VNA. Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1:
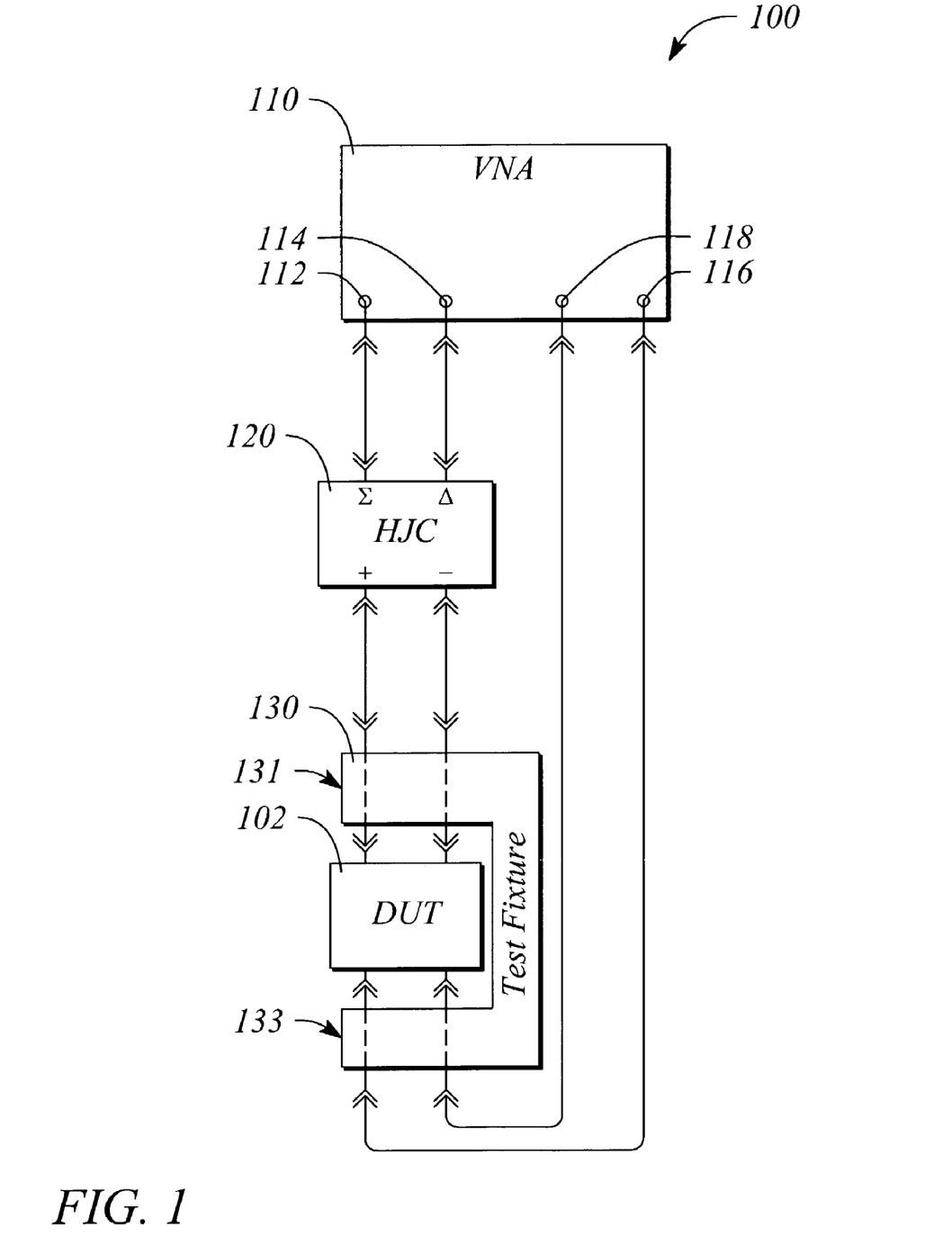
FIG. 1 illustrates a block diagram of a multiport vector network analyzer (VNA) measurement system for balanced device characterization according to an embodiment of the present invention.

FIG. 1 illustrates a block diagram of a multiport vector network analyzer (VNA) measurement system 100 for balanced device characterization according to an embodiment of the present invention. The multiport VNA measurement system 100 comprises a multiport VNA 110, a hybrid junction coupler 120, and a test fixture 130. The hybrid junction coupler 120 is connected between a pair of ports of the VNA 110 and a pair of input ports of the test fixture 130. Output ports of the test fixture 130 are connected to other ports of the multiport VNA 110. The test fixture 130 is adapted to hold and interface to a device under test (DUT) 102. In some embodiments, the test fixture 130 is omitted and the DUT 102 is connected between an output of the hybrid junction coupler 120 and the other ports of the multiport VNA.

In general, the DUT 102 is a balanced device having a differential input and a differential output. In some cases the DUT 102 may have one or more non-differential inputs and/or outputs in addition to the differential inputs and outputs. For example, a typical two-port balanced DUT 102 has a differential input port comprising a pair of differential inputs (i.e., two differential input ports) and a differential output port comprising a pair of differential outputs (i.e., two differential output ports).

The multiport VNA 110 may be any vector network analyzer having more than two ports. Alternatively, the multiport VNA 110 may be a two-port VNA or a three-port VNA in combination with an S-parameter test set that increases a number of available test ports to more than two. Preferably, the multiport VNA 110 has at least four test ports when testing a two-port balanced device, for example. Specifically, having four test ports available facilitates using one test port for each of the four differential ports (i.e., two input ports and two output ports) of the DUT 102.

For example, the multiport VNA 110 may be a model E5071B-413 four-port VNA manufactured by Agilent Technologies, Palo Alto, Calif. In another example, the multiport VNA is an Agilent Technologies, Inc., Model 8720ES VNA with a N4418A S-parameter test set. The combination of the 8720ES VNA and the N4418A S-parameter test set provides a 4-port multiport VNA with full 4-port error correction. Additional examples of multiport VNA configurations may be found in "Agilent Test Solutions for Multiport and Balanced Devices," Literature Number 5988-2461EN, Agilent Techologies, Inc., incorporated herein by reference. One skilled in the art may readily identify and select a suitable multiport VNA 110 without undue experimentation given the discussion herein.

The hybrid junction coupler 120, also referred to herein as the 'hybrid coupler' 120, is a four port device that converts single-ended signals into balanced signals. The hybrid coupler 120 is also sometimes referred to as a '180-degree' hybrid coupler 120 to distinguish the hybrid coupler 120 from a 90-degree, or quadrature hybrid coupler. Typically, a port of a pair of input ports of the hybrid coupler 120 is labeled or designated as a sum port ($\Sigma$) and another port of the input port pair is labeled or designated as a difference port ($\Delta$). A port of a pair of output ports of the hybrid coupler 120 often is labeled or designated as a positive (+) and another port of the output port pair is labeled or designated as a negative (−). Alternatively, the positive port sometimes may be designated as a '0-degree' port while the negative port is sometimes designated as a '180-degree' port.

A signal applied to the sum port $\Sigma$ of the hybrid coupler 120 is split into a pair of equal power, in-phase signals. The equal power, in-phase signals exit the hybrid coupler 120, each signal at a different one of the output ports. Similarly, a signal applied to the difference port $\Delta$ of the hybrid coupler 120 is split into a pair of equal power signals. However in the case of the difference port $\Delta$, one of the signals of the pair has a phase offset of 180 degrees relative to the other signal. The signal having the 180 degree phase offset exits the hybrid coupler 120 through the negative (−) output port while the other signal exits the positive output port (+). Thus, applying a signal to the sum port $\Sigma$ produces a pair of common-mode signals at the positive and negative output ports. Applying a signal to the difference port $\Delta$ produces a pair of differential-mode signals (i.e., signals having a 180 degree phase offset with respect to one another) at the positive and negative ports, respectively. An example of a commercially available hybrid coupler is an H-183-4 Hybrid Junction Coupler, manufactured by MA-Com, Inc., Lowell, Mass. One skilled in the art is familiar with a wide variety of hybrid couplers and manufacturers thereof, any of which may be used in conjunction with and is within the scope of the present invention. Moreover, one skilled in the art is familiar with other means of achieving the functionality of a hybrid junction coupler such as, but not limited to, a specialized transformer. All such means of achieving the functionality of a hybrid junction coupler may be used interchangeably with the hybrid junction coupler 120 described herein and are within the scope of the present invention.

The test fixture 130 is a fixture adapted for holding and interfacing to a device under test (DUT) 102. In most cases, the test fixture 130 is application specific and selected based on a particular DUT 102. In some cases, such as when the DUT 102 is equipped with input and output ports that may be connected directly to coaxial cables, a test fixture 130 may not be required. One skilled in the art is familiar with test fixtures and their use in conjunction with measuring S-parameters of DUTs 102.

Figure 2:
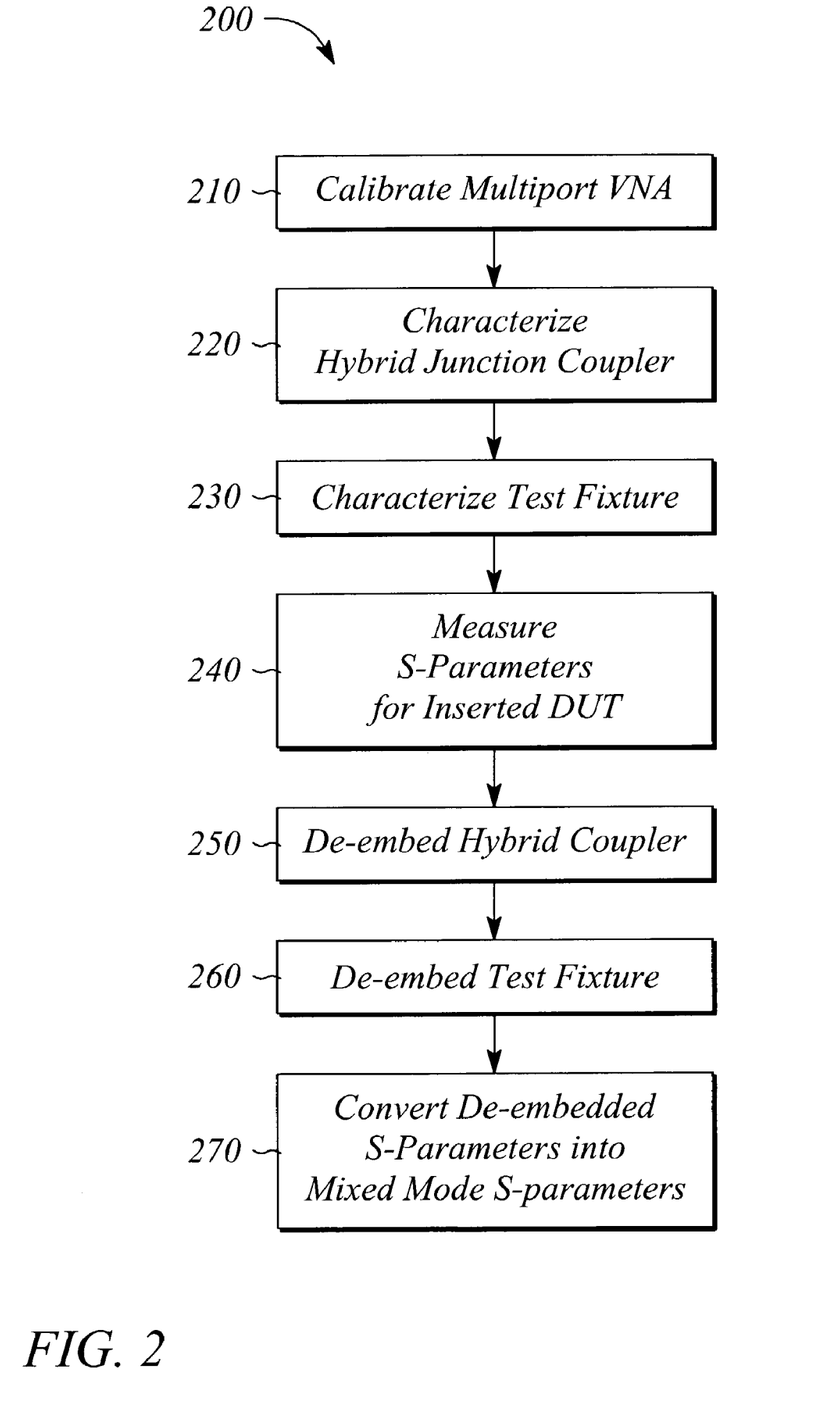
FIG. 2 illustrates a flow chart of a method of balanced device characterization using a multiport VNA measurement system according to an embodiment of the present invention.

FIG. 2 illustrates a flow chart of a method 200 of balanced device characterization using a multiport VNA measurement system according to an embodiment of the present invention. Specifically, the method 200 may be employed in conjunction with the multiport VNA measurement system 100 illustrated in FIG. 1. While described in terms of characterizing a two-port balanced device under test (DUT) 102, the method 200 is applicable to characterizing balanced devices having a single, single-ended output port or having more than two differential output ports. In particular given the discussion hereinbelow, one skilled in the art may readily extend the method 200 of balanced device characterization without undue experimentation to balanced devices having any number of differential input and output ports or even to devices have a mixture of balanced and single-ended ports.

The method 200 of balanced device characterization comprises calibrating 210 a multiport VNA, such as the multiport VNA 110. In particular, calibrating 210 may comprise employing a conventional, single-ended, calibration protocol or methodology to correct for systematic errors of the multiport VNA. Such a conventional, single-ended calibration protocol generally employs conventional single-ended calibration standards. For example, the calibration 210 of the multiport VNA may use a multiport version of a conventional short-open-load-thru (SOLT) calibration. In other words, the multiport VNA may have a 'built-in' calibration routine and employ a set of SOLT calibration standards supplied by a manufacturer of the multiport VNA. The manufacturer typically provides a user manual along with the multiport VNA that details steps of performing such a built-in calibration routine. Alternatively, a multiport calibration methodology specifically adapted to calibrating the multiport VNA may be employed. For example, a multiport VNA calibration methodology disclosed by Bockelman et al., U.S. Pat. No. 5,793,213, incorporated herein by reference, may be used to calibrate 210 the multiport VNA. Moreover, calibrating 210 may include effects of cabling between the multiport VNA and a hybrid junction coupler, such as the hybrid coupler 120. In short, any calibration methodology applicable to calibrating 210 the multiport VNA and any associated cabling are within the scope of the present invention.

The method 200 of balanced device characterization further comprises characterizing 220 the hybrid junction coupler. Characterizing 220 produces S-parameters that embody or enumerate an operational performance of the hybrid junction coupler. Thus for example, characterizing 220 may comprise directly or indirectly measuring S-parameters of the hybrid coupler using the previously calibrated 210 multiport VNA. Alternatively, another multiport VNA may be employed to measure the hybrid coupler S parameters. Preferably, the S-parameters are measured across a frequency band or range of interest that equals or exceeds a test frequency range of the DUT.

Characterizing 220 may comprise, alternatively to or in addition to measuring the S-parameters of the hybrid coupler, employing performance data, such as S-parameters or an equivalent, that are supplied by a manufacturer of the hybrid coupler (i.e., 'factory' supplied data). Since the hybrid coupler is a passive device, such 'factory calibrations' or factory-supplied data may often yield S-parameters having sufficient accuracy for many applications of the method 200. In yet another alternative, a model of the hybrid coupler may be used to generate S-parameters or an equivalent for the hybrid coupler. Thus, a computer model of the hybrid coupler may produce a modeled performance that approximates an actual performance of the hybrid coupler. Thus in this alternative embodiment, characterizing 220 may comprise using the model to produce S-parameters for the hybrid coupler from the approximated performance provided by the model. The approximated performance may be close enough to the actual performance to characterize 220 the hybrid coupler for the purposes of method 200.

While a variety of alternatives exist for characterizing 220 the hybrid coupler, directly measuring the S-parameters of the hybrid coupler using the calibrated 210 multiport VNA is generally preferred. In particular, with respect to characterizing 220 the hybrid coupler of the method 200, directly measuring the hybrid coupler S-parameters typically minimizes an introduction of potential errors into the resulting S-parameter data for the hybrid coupler.

The method 200 of balanced device characterization optionally further comprises characterizing 230 a test fixture, such as the test fixture 130. Characterizing 230 the test fixture may be omitted when characterizing 200 a balanced device that does not need or use a test fixture. One skilled in the art may readily determine whether or not a test fixture is needed for a particular balanced device being characterized.

As with characterizing 220 the hybrid coupler, characterizing 230 the test fixture may be accomplished in a variety of ways. Also as with characterizing 220 the hybrid coupler, characterizing 230 the test fixture preferably comprises measuring S-parameters of the test fixture. For example, the test fixture may be 'divided' for the purposes of characterization 230 into an input portion and an output portion. The input portion comprises a portion of the test fixture between an input of the test fixture and an input port of the DUT while the output portion comprises a portion of the test fixture between an output port of the DUT and an output of the test fixture. Characterizing 230 the test fixture may comprise measuring S-parameters separately for each of the input portion and the output portion of the test fixture, for example.

The method 200 of balanced device characterization further comprises measuring 240 S-parameters for a balanced device under test, such as the DUT 102, inserted in the multiport VNA measurement system. In some embodiments the balanced device is placed in the characterized 230 test fixture of the multiport VNA measurement system 100. In other embodiments when the test fixture is omitted, the balanced device is connected between output ports of the characterized 220 hybrid coupler and test ports of the calibrated 210 multiport VNA.

Measuring 240 S-parameters for the balanced device produces measured S-parameters for the balanced device. However, while the measured S-parameters represent a performance of the balanced device, the measured S-parameters also include an influence from the characterized 220 hybrid coupler and, when the test fixture is present, an influence from the characterized 230 test fixture. As such, the measured S-parameters for the balanced device produced by such measuring 240 are corrupted by residual error components associated with a non-ideal performance of the characterized 220 hybrid coupler and of the optional characterized 230 test fixture of the multiport VNA measurement system. In other words, a calibration reference plane of the calibrated 210 multiport VNA lies between the characterized 220 hybrid coupler and either the output of the optional characterized 230 test fixture or an output of the balanced device when measuring 240 is performed. Additional processing of the measured S-parameters is performed to remove the residual error components and to produce S-parameters that more accurately represent a performance of the balanced device according to the present invention.

Consider characterizing the two-port DUT 102 using the multiport VNA measurements system 100, for example. The DUT 102 is placed in and connected to the test fixture 130 of the measurement system 100. The calibrated 210 multiport VNA 110 then makes two frequency sweeps measuring output signals at two output ports of the test fixture 130 and measuring output/reflected signals at the input ports of the hybrid junction coupler 120. During a first frequency sweep of the two frequency sweeps, the multiport VNA 110 uses as a stimulus signal source a first VNA port 112 connected to the sum port (Σ) of the hybrid coupler 120. The action of the hybrid coupler 120 results in a common mode stimulus signal being applied by way of the test fixture 130 to the two differential input ports of the DUT 102. During a second frequency sweep of the two frequency sweeps, the multiport VNA 110 uses as the stimulus signal source a second VNA test port 114 connected to the difference port (Δ) of the hybrid junction coupler 120. The action of the hybrid coupler 120 results in a differential mode stimulus signal being applied by way of the test fixture 130 to the two differential input ports of the DUT 102. Signals exiting the DUT 102 at the DUT output ports are measured by a third test port 116 and a fourth test port 118 of the multiport VNA 110. Signals exiting or reflecting from the hybrid coupler 120 are measured by the first and second ports 112, 114 of the multiport VNA 110. In general, at least two more sweeps that employ the third and fourth test ports 116, 118 as the stimulus signal source are then performed. Transmitted and reflected signals at the test fixture 130 outputs and hybrid coupler 120 inputs are measured.

Therefore, after four sweeps, a full set of measured four-port S-parameters is computed from the measured signals. The calibrated reference plane of the measured S-parameters is at an input of the hybrid coupler 120 and outputs of the output portion of the test fixture 130, for the example. Of course the location of the calibrated reference plane in the example assumes that the multiport VNA 110 is calibrated at respective ends of cables that connect the test ports 112, 114 and the test ports 116, 118 of the multiport VNA 110 to the hybrid coupler 120 and test fixture 130 outputs, respectively.

As used herein, a 'measurement reference plane' or a 'reference plane' is a point in a circuit or system to which measurements of magnitude and phase are referenced. By definition, measurements of signal magnitude and phase equal zero at the reference plane. A 'calibrated' reference plane is a point in a system at which a calibration of the system is performed or referenced. As such, an error correction of data taken by the system effectively establishes or moves the measurement reference plane to the point of calibration thereby establishing the calibrated reference plane. One skilled in the art is familiar with the concepts of reference plane and calibrated reference plane, as they are associated with VNAs and measurements produced by VNA measurement systems.

The method 200 of balanced device characterization further comprises de-embedding 250 the characterized 220 hybrid junction coupler from the measured 240 S-parameters. De-embedding 250 the characterized 220 hybrid coupler essentially removes an effect of the hybrid coupler on the measured S-parameters using a mathematical manipulation. De-embedding 250 produces a first set of de-embedded S-parameters from the measured S-parameters and the S-parameters of the characterized 220 hybrid coupler. The first set of de-embedded S-parameters essentially represents the measured S-parameters corrected for effects of, or errors associated with, the hybrid coupler. In other words, de-embedding 250 effectively moves the calibrated reference plane to a point beyond the hybrid coupler.

The method 200 of balanced device characterization further comprises de-embedding 260 the characterized 230 test fixture from the first set of de-embedded S-parameters. De-embedding 260 the characterized 230 test fixture essentially removes an effect of the test fixture on the measured S-parameters using a mathematical manipulation. De-embedding 260 the characterized 230 test fixture produces a second set of de-embedded S-parameters from the first set of de-embedded S-parameters and the S-parameters of the characterized 230 test fixture. The second set of de-embedded S-parameters essentially represents the measured S-parameters corrected for effects of, or errors associated with, both the hybrid coupler and the test fixture. In other words, de-embedding 260 the characterized 230 test fixture effectively moves the calibrated reference plane to a point beyond the test fixture. As such, the second set of de-embedded S-parameters essentially represents error-corrected or calibrated, measured single-ended S-parameters for the DUT.

As already mentioned hereinabove, 'de-embedding' refers to a mathematical manipulation of S-parameters to remove an effect of an 'embedded' device from the S-parameters. In particular, de-embedding and embedding are discussed in detail in Application Note 1364-1, "De-embedding an Embedding S-parameter Networks Using a Vector Network Analyzer", Agilent Technologies, Inc., incorporated herein by reference. Additional details of de-embedding are provided a co-pending patent application by Vahe A. Adamian, U.S. Ser. No. 10/098,040, entitled "Method, Apparatus, and Article of Manufacture for Characterizing a Device and Predicting Electrical Behavior of the Device in a Circuit", filed Mar. 14, 2002, incorporated by reference herein. One skilled in the art is familiar with embedding and de-embedding with respect to S-parameters of combinations of devices and in particular with respect to obtaining S-parameters of a DUT using a VNA.

In some embodiments, mixed mode S-parameters for the balanced DUT are desired. In such embodiments, the method 200 of balanced device characterization further comprises converting 270 the second set of de-embedded S-parameters into mixed mode S-parameters using modal decomposition. Modal decomposition recognizes a one-to-one correspondence between single-ended S-parameters for a balanced device and mixed mode S-parameters for the device. Mixed mode S-parameters are disclosed by Bockelman et al., "Combined differential and Common-Mode Scattering Parameters: Theory and Simulation," *IEEE Transactions on Microwave Theory and Techniques*, Vol. 43, No. 7, July 1995, pp. 1530–1539, incorporated by reference herein. Converting between single-ended and mixed mode S-parameters using modal decomposition is further described by Bockelman et al., U.S. Pat. No. 5,751,153 ('153), incorporated herein by reference. In particular, Bockelman et al. ('153) provide equations for converting 270 single-ended S-parameters into mixed mode S-parameters.

To better appreciate the method 200 of balanced device characterization, consider an example of using the method 200 and the system 100 to characterize a two-port balanced device under test (DUT). Thus, the DUT has a pair of input ports and a pair of output ports. For the purposes of the example, assume that the multiport VNA 110 is a four port VNA, such as the aforementioned Agilent Technologies model E5071B-413. The hybrid coupler 120 is a commercially available hybrid junction coupler having a pair of input ports labeled Σ and Δ, respectively, and a pair of output ports labeled '+' and '−', respectively. The test fixture 130 has an input portion 131 and an output portion 133.

The four-port VNA 110 is calibrated 210 following a calibration protocol recommended by the VNA manufacturer. The calibration 210 in this example includes RF cabling used to connect the VNA 110 to the hybrid coupler 120 and to an output portion 133 of the test fixture 130. As a result, the calibration 210 enables error corrected S-parameters to be measured at respective ends of four cables connected to four test ports of the VNA 110.

The hybrid coupler 120 is characterized 220 by using the calibrated VNA 110 to measure single-ended S-parameters for the hybrid coupler 120. The result of the characterization 220 is a four-by-four S-parameter matrix $[S_c]$. The test fixture 130 is characterized 230 by using the calibrated VNA 110 to measure single-ended S-parameters separately for the input portion 131 and the output portion 133. The result of characterizing the test fixture 130 is a four-by-four S-parameter matrix $[S_{fa}]$ for the input portion 131 and a four-by-four S-parameter matrix $[S_{fb}]$ for the output portion 133.

The DUT 102 is inserted into the test fixture 130 and S-parameters are measured 240 for the DUT 102 using the calibrated VNA 110. The measured S-parameters correspond to measurement reference planes at the input ports of the hybrid coupler 120 and the output ports of the output portion 133 of the test fixture 130. A four-by-four S-parameter matrix $[S_{raw}]$ is produced by measuring 240 in the example.

Next, the effects of the hybrid coupler 120 are removed from the measured S-parameters by de-embedding 250. To perform de-embedding 250, it is convenient if the S-parameters are transformed into T-parameters. One skilled in the art is familiar with T-parameters and a transformation between S-parameters and T-parameters. For example, Appendix A of Agilent Application Note 1364-1 cited hereinabove provides equations for such a transformation. Transforming the hybrid coupler S-parameter matrix $[S_c]$ yields a hybrid coupler T-parameter matrix $[T_c]$. Similarly, transforming the measured S-parameters $[S_{raw}]$ yield a measured T-parameter matrix $[T_{raw}]$. De-embedding 250 involves multiplying the measured T-parameter matrix by an inverse of the hybrid coupler T-parameters matrix as given by equation (1).

$$[T_{d1}] = [T_c]^{-1} \cdot [T_{raw}] \quad (1)$$

The result of the multiplication is a first de-embedded T-parameter matrix $[T_{d1}]$ representing the first set of de-embedded S-parameters. While a transformation from T-parameters to S-parameters may be performed at this point, it is convenient to leave the results of equation (1) in the T-parameter form since another de-embedding operation is yet to be performed.

The effects of the test fixture 130 are removed from the measured S-parameters by de-embedding 260 the test fixture 130. In particular, a second de-embedded T-parameter matrix $[T_{d2}]$ is computed from the first de-embedded T-parameter matrix $[T_{d1}]$ using equation (2).

$$[T_{d2}] = [T_{fa}]^{-1} \cdot [T_{d1}] \cdot [T_{fb}]^{-1} \quad (2)$$

where $[T_{fa}]$ is a T-parameter matrix computed by transforming the S-parameter matrix $[S_{fa}]$, and $[T_{fb}]$ is a T-parameter matrix computed by transforming the S-parameter matrix $[S_{fb}]$.

The resulting second de-embedded T-parameter matrix $[T_{d2}]$ represents a T-parameter matrix $[T_{d2}]$ of the DUT without the errors associated with the hybrid coupler 120 and the test fixture 130. A single-ended second de-embedded S-parameter matrix $[S_{d2}]$ may be produced by transforming the second de-embedded T-parameter matrix $[T_{d2}]$. Of course, the second de-embedded S-parameter matrix is equivalent to a single-ended DUT S-parameter matrix. Such a transformation from a T-parameter matrix to a S-parameter matrix also is known to those skilled in the art.

Mixed mode S-parameters for the DUT may be computed by converting 270 the second set of de-embedded S-parameters into mixed mode S-parameters using modal decomposition. Namely, an equation from Bockelman ('153), presented herein as equation (3), may be employed.

$$[S_{mm}] = [M] \cdot [S_{d2}] \cdot [M]^{-1} \quad (3)$$

where $$M = \frac{1}{\sqrt{2}} \cdot \begin{bmatrix} 1 & -1 & 0 & 0 \\ 0 & 0 & 1 & -1 \\ 1 & 1 & 0 & 0 \\ 0 & 0 & 1 & 1 \end{bmatrix}$$

The resulting S-parameter matrix $[S_{mm}]$ represents mixed mode S-parameters for the DUT without an influence from either the hybrid coupler 120 or the test fixture 130. Thus, the balanced DUT has been characterized in a 'calibrated' sense according to the example of method 200 presented hereinabove.

Figure 3:
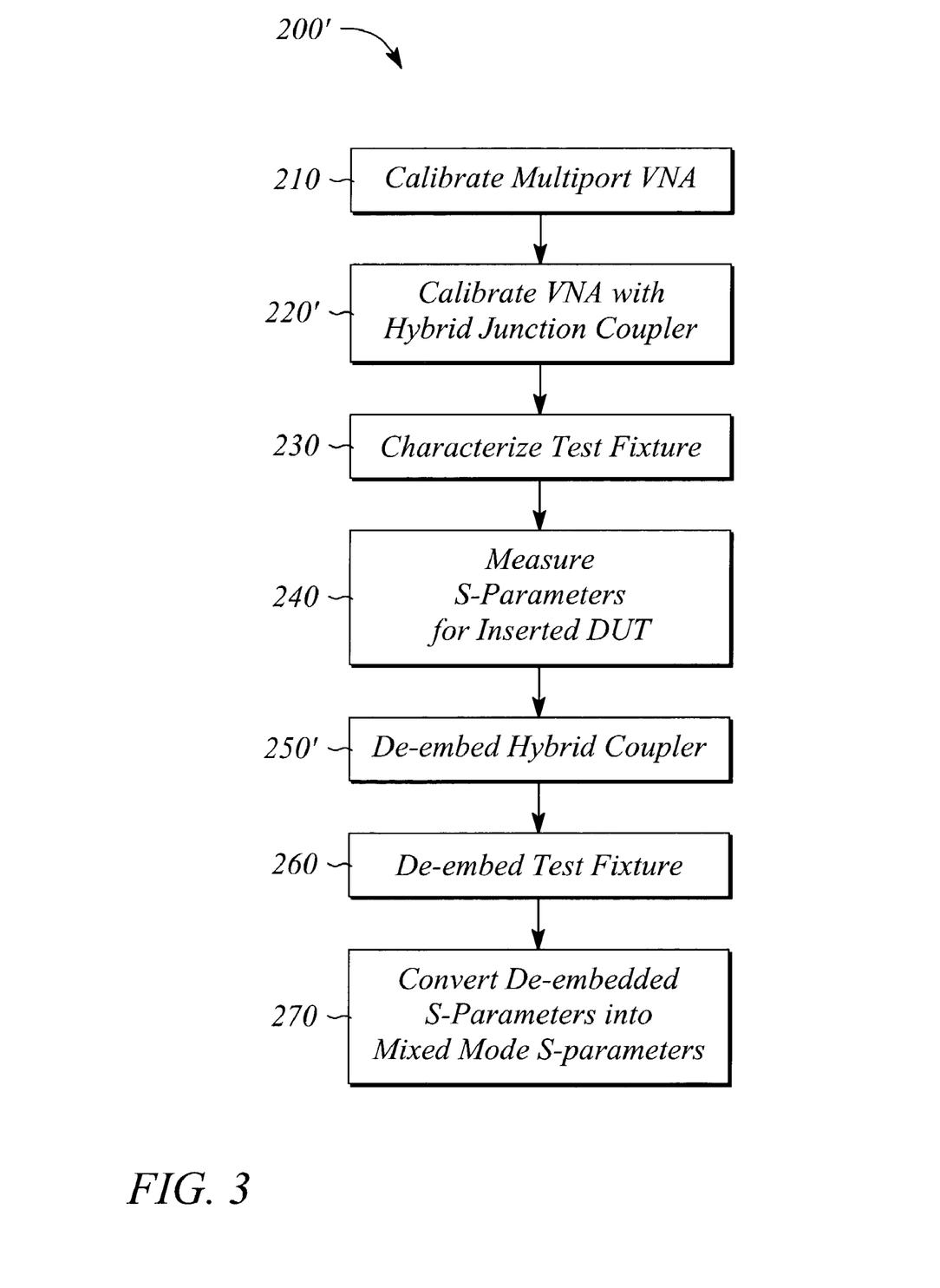
FIG. 3 illustrates a flow chart of another embodiment of a method of balanced device characterization according to the present invention.

FIG. 3 illustrates a flow chart of another embodiment of a method 200' of balanced device characterization according to the present invention. In particular, the method 200' embodiment is similar to method 200 except that instead of directly characterizing 220 the hybrid coupler 120, the method 200' employs an indirect characterization.

Method 200' of balanced device characterization comprises calibrating 210 a multiport VNA, such as the VNA 110. The method 200' further comprises calibrating 220' the multiport VNA with a hybrid coupler, such as the hybrid coupler 120, attached thereto. In particular, after calibrating 210 the multiport VNA 110, the hybrid coupler 120 is connected to the multiport VNA 110 as described hereinabove with respect to the system 100. A calibration 220' is then performed at the positive and negative ports of the hybrid coupler.

Preferably, calibrating 220' employs a so-called '16-term' error model-based calibration. The 16-term error model extends the conventional 8-term error model to include additional error terms associated with cross talk between ports. The 16-term error model and calibration based on such an error model are familiar to one skilled in the art. For example, Hugo Van hamme and Marc Vanden Bossche, "Flexible Vector Network Analyzer Calibration with Accuracy Bounds using an 8-Term or a 16-Term Error Correction Model," *IEEE Transactions on Microwave Theory and Techniques*, Vol. 42, No. 6, June 1994, pp 976–987, incorporated by reference herein, present a review of the 16-term error model and its use in VNA calibration.

The method 200' further comprises characterizing 230 a test fixture, such as test fixture 130, when the test fixture is present; followed by measuring 240 S-parameters for a DUT, such as DUT 102, inserted into the VNA system 100. Characterizing 230 the test fixture and measuring 240 S-parameters are described hereinabove with respect to method 200.

The method 200' further comprises de-embedding 250' the hybrid coupler. De-embedding 250' of the method 200' differs from de-embedding 250 of the method 200 in that the S-parameters for the hybrid coupler are not measured directly in method 200'. Instead as described hereinabove, the hybrid coupler S-parameters are represented in terms of a difference between error terms determined from the VNA calibration 210 and error terms determined from the calibration 220' of the VNA with the hybrid coupler. Therefore, the hybrid coupler S-parameters must be essentially 'extracted' from the error coefficients before the S-parameters may be used for de-embedding 250'. One skilled in the art is familiar with de-embedding using a pair of VNA calibrations. For example, details of such de-embedding methodologies and a comparison with the directly measured S-parameter de-embedding are described in Agilent Application Note 1364-1 cited hereinabove.

The method 200' further comprises de-embedding 260 the test fixture and converting 270 the de-embedded S-parameters into mixed mode S-parameters using modal decomposition. De-embedding 260 and converting 270 are described hereinabove with respect to the method 200.

Figure 4:
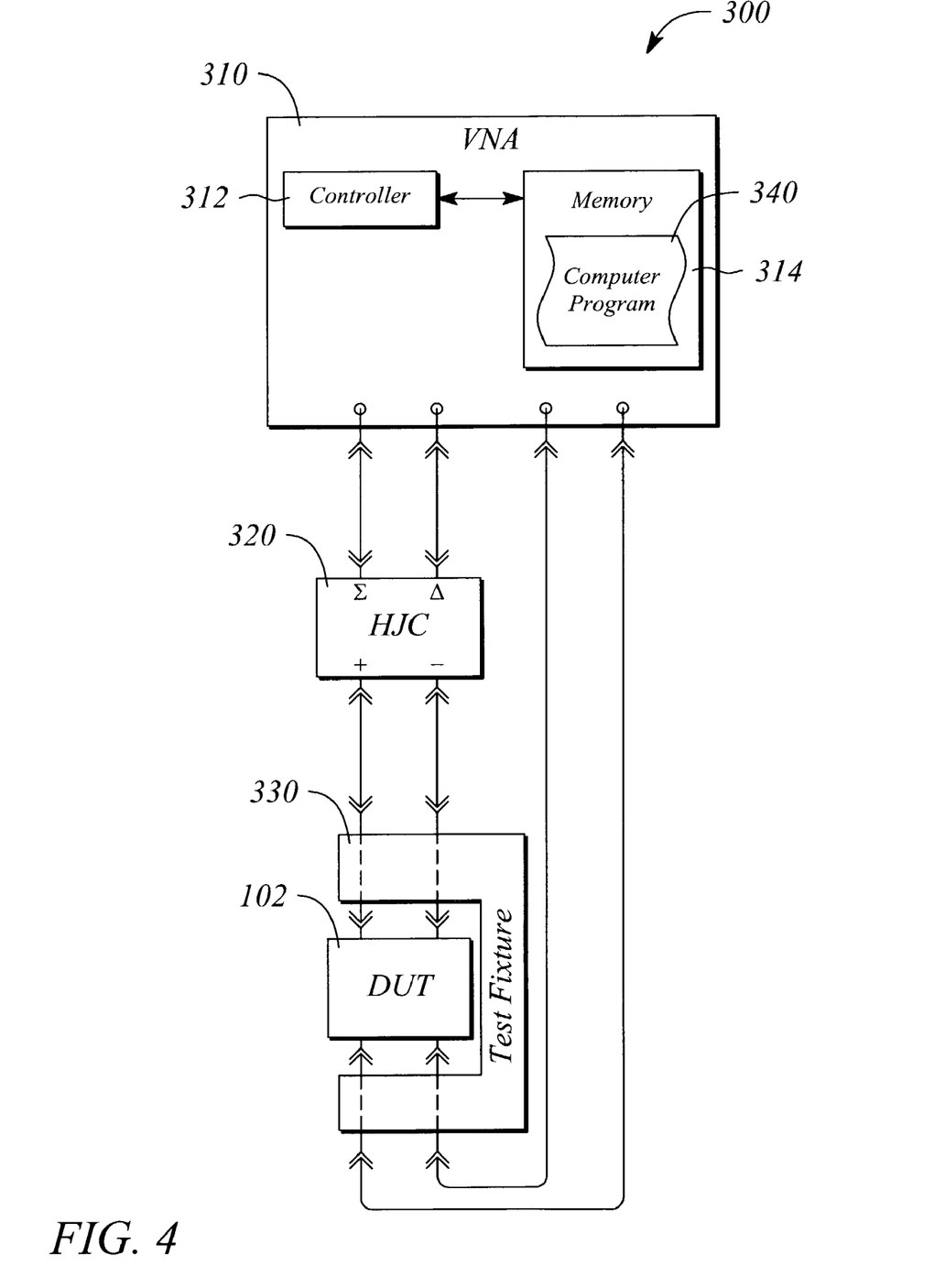
FIG. 4 illustrates a block diagram of a test system for balanced device characterization according to an embodiment of the present invention.
Figure 5:
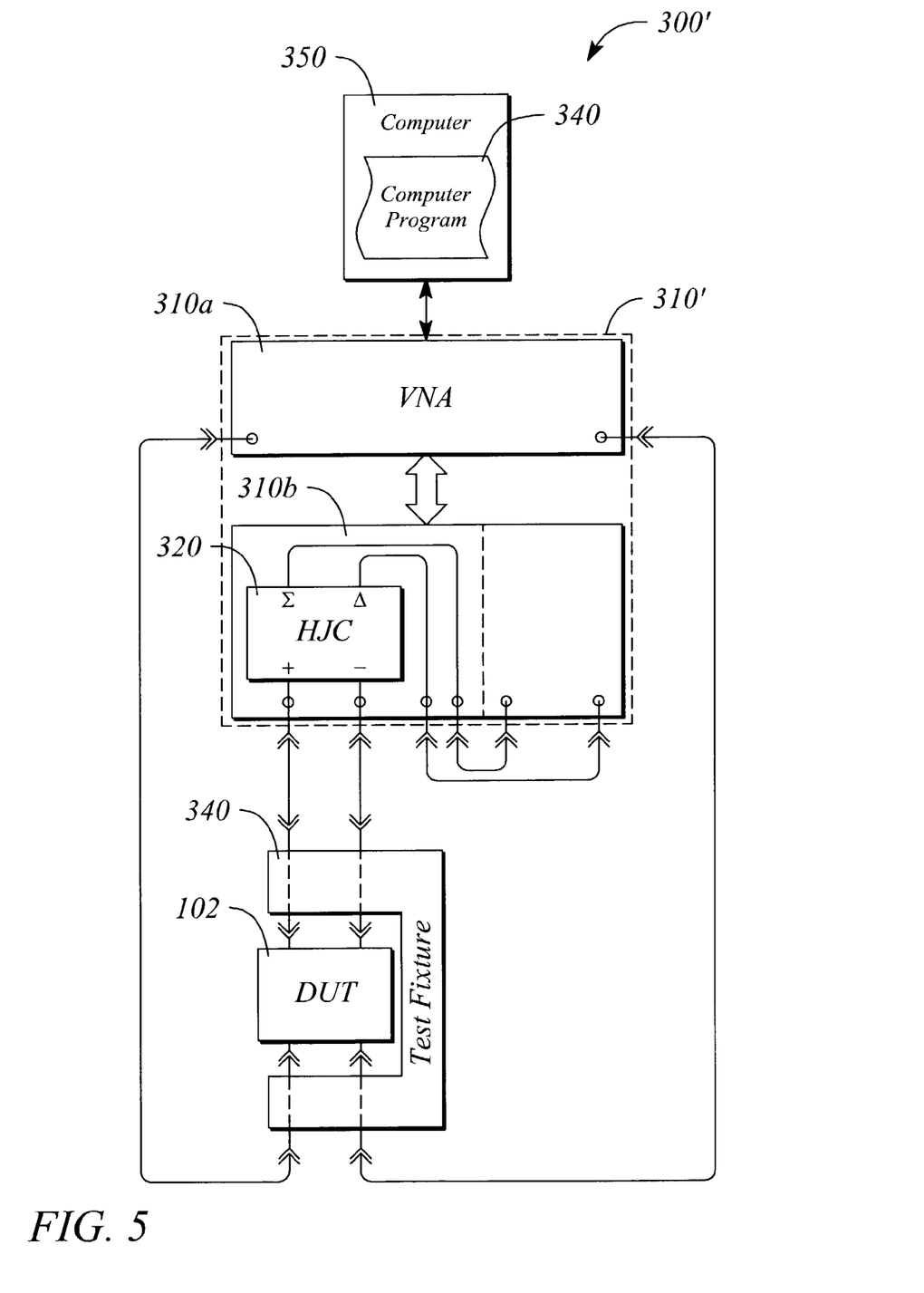
FIG. 5 illustrates a block diagram of an embodiment of another test system for balanced device characterization according to the present invention.

FIG. 4 illustrates a block diagram of a test system 300 for balanced device characterization according to an embodiment of the present invention. FIG. 5 illustrates a block diagram of an embodiment of another test system 300' for balanced device characterization according to the present invention. The test system 300 comprises a multiport VNA 310, a hybrid junction coupler 320, and a test fixture 330. The hybrid junction coupler 320 is connected between a pair of ports of the VNA 310 and a pair of input ports of the test fixture 330. Output ports of the test fixture 330 are connected to other ports of the multiport VNA 310. The test fixture 330 is adapted for holding and interfacing to a device under test (DUT) 102. In some embodiments, the test fixture is omitted and the DUT 102 is connected between an output of the hybrid junction coupler and the other ports of the multiport VNA.

The multiport VNA 310 is essentially the multiport VNA 110 described hereinabove with respect to the multiport VNA measurement system 100. Similarly, the hybrid junction coupler 320 and test fixture 330 are essentially the hybrid junction coupler 120 and the test fixture 130, respectively, of the measurement system 100 described hereinabove.

The test system 300 further comprises a computer program 340. The computer program 340 may be resident in a memory 314 of and executed by a controller 312 of the multiport VNA 310. Such an embodiment of the test system 300 is illustrated in FIG. 4. When executed, instructions of the computer program 340 control the test system 300 and process S-parameter data measured by the test system 300. Through such control and processing, the executed computer program 340 characterizes a balanced device in accordance with the present invention.

The computer program 340 comprises instructions that calibrate the multiport VNA 310. The computer program 340 further comprises instructions that measure S-parameters of the hybrid coupler 320 and measure S-parameters of the test fixture 330, when present. The computer program 340 further comprises instructions that measure S-parameters for a device under test (DUT) inserted into the test fixture 330. The computer program 340 further comprises instruction that de-embed the measured S-parameters of the hybrid coupler 320 and that de-embed the measured S-parameters of the test fixture 330 from the measured S-parameters for the DUT 102 to generate de-embedded S-parameters for the DUT. The computer program 340 further comprises instructions that employ modal decomposition to convert the de-embedded S-parameters into mixed mode S-parameters for the DUT 102. In a preferred embodiment, the computer program 340 implements the method 200, 200' of balanced device characterization.

Line stretchers (not illustrated) may be employed with the test system 300 to balance output signals applied to the DUT 102. The line stretchers enable adjusting and minimizing a signal skew of signals being applied to the DUT 102. One skilled in the art would readily recognize when to employ line stretchers. For example, a 23-degrees phase shift or skew between signals applied to a pair of differential input ports of the DUT 102 will convert a perfectly balanced signal (i.e., no common mode signal), as produced by the hybrid coupler 320, into an unbalanced signal with a common mode signal equal to approximately 10 percent of a differential mode signal. Such an imbalance may cause the DUT 102 to behave in an unexpected or unintended manner. The line stretcher may be employed before and/or after the hybrid coupler 320 in the test system 300.

In the other embodiment of the test system 300' illustrated in FIG. 5, the computer program 340 is instead resident in and executed by an auxiliary computer controller 350 such as a personal computer. FIG. 5 illustrates a block diagram of the test system 300' for balanced device characterization according to the present invention. The computer controller 350 may be connected to and communicates with a VNA 310' using any one of several available interfaces including, but not limited to, a universal serial bus (USB), an IEEE-488, and an 802.11b wireless interface. Through the interface, the computer controller 350 controls the operation of the VNA 310' and receives data from the VNA 310'. Execution instructions of the computer program 340 provide the control commands and process the received data. Advantageously, the use of the computer controller 350 enables virtually any multiport capable VNA to be used as the multiport VNA 310' in the test system 300'.

In addition to employing the auxiliary computer controller 350, the test system 300' as illustrated in FIG. 5 differs from the test system 300 in that the VNA 310' is a system that comprises a two-port VNA 310a and a test set 310b according to some embodiments. The hybrid coupler 320 is mounted inside the test set 310b that, combined with the two-port VNA 310a, make up the multiport VNA 310'. The inside-mounted hybrid coupler 320 is accessed by way of jumpers installed between output and input ports of the test set 310b. Thus for the method 200, 200', the jumpers may be removed to characterize 220, 220' the hybrid coupler 320 and then replaced to measure 240 the S-parameters of the balanced device.

One skilled in the art will readily recognize that mounting the hybrid coupler 320 within the test set 310b may have manufacturing and marketing advantages compared to an externally mounted hybrid coupler 320. Similarly, one skilled in the art will recognize that switches may be used to effect connecting and disconnecting the hybrid coupler 320 instead of jumpers. Such an embodiment, as well as various other permutations of the embodiments described hereinabove, are within the scope of the present invention. For example, an embodiment (not illustrated) that employs the auxiliary computer controller 350 with the test system 300 is within the scope of the present invention.

Moreover, given the discussion herein one skilled in the art may readily extend the method 200, 200' and the test 300, 300' to a full-balanced implementation. For example, a full-balanced embodiment of the test system 300, 300' may be realized by employing a hybrid junction coupler 320 on an input side (e.g., as described hereinabove) and a hybrid junction coupler (not illustrated) an output side of the DUT 102. The method 200, 200' of characterizing the balanced device is readily extended to accommodate such a full-balanced embodiment by separately characterizing 240 both the input side hybrid coupler and the output side the hybrid coupler followed by separately de-embedding 250 each of the respective hybrid couplers from the measured S-parameter data.

Thus, there have been described various embodiments of the present invention that facilitate balanced device characterization. In particular, a method of balanced device characterization that includes calibration has been described. In addition, a test system for calibrated balanced device characterization has been described. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. A method of balanced device characterization using a vector network analyzer (VNA) measurement system comprising:
   measuring mixed mode S-parameters of a balanced device under test (DUT) by de-embedding an uncalibrated portion of the VNA measurement system from S-parameter measurements of the balanced DUT.

2. The method of claim 1, wherein the VNA measurement system comprises a multiport VNA and a hybrid junction coupler, the hybrid junction coupler being connected to a pair of test ports of the multiport VNA, the system optionally further comprising a test fixture, the test fixture being connected between outputs of the hybrid junction coupler and another pair of test ports of the multiport VNA, wherein the uncalibrated portion of the VNA measurement system comprises the hybrid-junction coupler and the optional test fixture.

3. The method of claim 1, wherein measuring mixed mode S-parameters comprises:
   calibrating a multiport VNA of the VNA measurement system;
   characterizing the uncalibrated portion of the VNA measurement system;
   measuring single-ended S-parameters for the balanced DUT with the calibrated multiport VNA to produce measured single-ended S-parameters;
   de-embedding the characterized uncalibrated portion from the measured single-ended S-parameter to produce de-embedded single-ended S-parameters; and
   converting the de-embedded single-ended S-parameters into mixed mode S-parameters for the DUT using modal decomposition.

4. The method of claim 3, wherein characterizing the uncalibrated portion of the VNA measurement system comprises characterizing a hybrid junction coupler connected between test ports of the multiport VNA and input ports of the balanced DUT, and wherein de-embedding the uncalibrated portion comprises de-embedding the characterized hybrid junction coupler.

5. The method of claim 4, wherein characterizing the uncalibrated portion of the VNA measurement system further comprises characterizing a test fixture connected between outputs of the hybrid junction coupler and other test ports of the multiport VNA, the test fixture interfacing the balanced DUT to the multiport VNA and the hybrid junction coupler for measuring, and wherein de-embedding the uncalibrated portion further comprises de-embedding the characterized test fixture.

6. The method of claim 4, wherein characterizing the hybrid junction coupler comprises determining S-parameters that represent an operational performance of the hybrid junction coupler over a frequency range of interest.

7. The method of claim 4, wherein the characterizing the hybrid junction coupler comprises one or more of measuring S-parameters of the hybrid junction coupler using either the calibrated multiport VNA or another VNA, employing S-parameters for the hybrid junction coupler supplied by a manufacturer of the hybrid junction coupler, and modeling a performance of the hybrid junction coupler using a computer model and extracting S-parameters from the modeled performance.

8. The method of claim 4, wherein characterizing the hybrid junction coupler comprises further calibrating the multiport VNA with the hybrid junction coupler connected to the multiport VNA, the further calibration being performed at output ports of the hybrid junction coupler, such that error terms of an error model for the multiport VNA calibration and error terms for an error model of the multiport VNA and hybrid junction coupler calibration are separately determined.

9. The method of claim 8, wherein S-parameters of the characterized hybrid junction coupler are determined from a difference between the error terms of the multiport VNA calibration and the error terms of the multiport VNA and hybrid junction coupler calibration.

10. A method of balanced device characterization using a multiport vector network analyzer (VNA) comprising:
    calibrating the multiport VNA;
    characterizing a hybrid junction coupler used with the multiport VNA;
    characterizing a test fixture when used to interface a balanced device under test (DUT) to the multiport VNA and the hybrid junction coupler;
    measuring S-parameters for the balanced DUT with the calibrated multiport VNA to produce measured S-parameters;
    de-embedding the characterized hybrid junction coupler from the measured S-parameters; and
    de-embedding the characterized test fixture from the measured S-parameters when the test fixture is used,
    wherein de-embedded S-parameters produced by the de-embedding(s) represent a characterized balanced DUT in terms of single-ended S-parameters.

11. The method of claim 10, further comprising:
    converting the de-embedded S-parameters into mixed mode S-parameters using modal decomposition.

12. The method of claim 10, wherein characterizing the hybrid junction coupler comprises one or more of measuring S-parameters of the hybrid junction coupler using the calibrated multiport VNA or another VNA, employing S-parameters for the hybrid junction coupler supplied by a manufacturer of the hybrid junction coupler, and modeling a performance of the hybrid junction coupler using a computer model and extracting S-parameters from the modeled performance of the hybrid junction coupler.

13. The method of claim 10, wherein characterizing the hybrid junction coupler comprises further calibrating the multiport VNA with the hybrid junction coupler connected to the multiport VNA, the further calibration being performed at output ports of the hybrid junction coupler, such that error terms of an error model for the multiport VNA calibration and error terms for an error model of the multiport VNA and hybrid junction coupler calibration are separately determined.

14. The method of claim 13, wherein S-parameters of the characterized hybrid junction coupler are determined from a difference between the error terms of the multiport VNA calibration and the error terms of the multiport VNA and hybrid junction coupler calibration.

15. The method of claim 10, wherein characterizing the test fixture when used comprises producing S-parameters that represent an operational performance of the test fixture, the S-parameters being produced from one or more of measurements of the S-parameters, test fixture vendor supplied S-parameter data, and modeled S-parameter data using a computer model of the test fixture, wherein the S-parameters measurements are produced using either the calibrated multiport VNA or another VNA.

16. The method of claim 10, wherein measuring S-parameters of the balanced DUT comprises measuring output signals at output ports of the balanced DUT and output reflected signals at input ports of the hybrid junction coupler during multiple frequency sweeps with the multiport VNA.

17. The method of claim 16, wherein measuring output signals at output ports of the balanced DUT comprises applying a balanced signal to input ports of the balanced DUT, the balanced signal comprising a common mode signal applied during a first frequency sweep, and a differential mode signal applied during a second frequency sweep.

18. The method of claim 10, wherein de-embedding the characterized hybrid junction coupler comprises producing a first set of de-embedded S-parameters from the measured S-parameters and S-parameters of the characterized hybrid junction coupler, the produced first set comprising measured S-parameters corrected for effects of the hybrid junction coupler.

19. The method of claim 18, wherein de-embedding the characterized test fixture comprises producing a second set of de-embedded S-parameters from the first set and S-parameters of the characterized test fixture, the produced second set comprising measured S-parameters corrected for effects of the hybrid junction coupler and the test fixture, such that the second set of de-embedded S-parameters are error-corrected measured S-parameters for the balanced DUT.

20. A test system for balanced device characterization comprising:
a multiport vector network analyzer (VNA) measurement system that comprises a calibrated portion including a multiport VNA, and an uncalibrated portion that produces a balanced signal, the multiport VNA measuring S-parameters of a balanced device under test (DUT) using the balanced signal; and
a computer program comprising instructions that implement using de-embedded measured S-parameters of the balanced DUT to characterize the balanced DUT, the de-embedded measured S-parameters being measured S-parameters that are corrected for errors introduced by the uncalibrated portion.

21. The test system of claim 20, wherein the uncalibrated portion comprises a hybrid junction coupler interfaced between the multiport VNA and the balanced DUT, and a test fixture that is optionally used to interface the hybrid junction coupler and the multiport VNA to the balanced DUT.

22. The test system of claim 20, wherein the instructions of the computer program comprise instructions that implement calibrating the multiport VNA, characterizing the uncalibrated portion of the test system, measuring S-parameters of the balanced DUT with the calibrated multiport VNA, and de-embedding the uncalibrated portion characterization from the S-parameter measurements, such that the de-embedded measured S-parameter of the balanced DUT result.

23. The test system of claim 22, wherein the instructions of the computer program further comprise instructions that implement converting the de-embedded measured S-parameters into mixed mode S-parameters using modal decomposition.

24. The test system of claim 20, wherein the multiport VNA comprises a processor, the processor executing the computer program.

25. The test system of claim 20, further comprising an auxiliary computer processor external to the multiport VNA, the auxiliary computer processor executing the computer program.

26. The test system of claim 20, wherein a balanced signal is used to drive the balanced DUT when S-parameters of the balanced DUT are measured, the balanced signal comprising a common mode signal applied to the balanced DUT during a first frequency sweep of the multiport VNA, and a differential mode signal applied to the balanced DUT during a second frequency sweep of the multiport VNA.

27. The test system of claim 20, wherein the balanced signal comprising a common mode signal applied to the balanced DUT during a first frequency sweep of the multiport VNA, and a differential mode signal applied to the balanced DUT during a second frequency sweep of the multiport VNA.

28. A method of balanced device characterization using a multiport vector network analyzer (VNA) test system comprising:
driving a balanced device under test (DUT) with a balanced signal to generate single-ended S-parameter measurements for the balanced DUT; and
de-embedding an effect of a component of the VNA test system that corrupts the measurements from the S-parameter measurements to yield de-embedded single-ended S-parameters that characterize the balanced DUT.

29. The method of claim 28, further comprising converting the de-embedded single-ended S-parameters for the DUT into mixed mode S-parameters for the DUT.

30. The method of claim 28, wherein the component of the VNA test system that corrupts the measurements comprises a hybrid junction coupler used to produce the balanced signal and a test fixture when optionally used to interface the balanced DUT with the VNA test system.

* * * * *

UNITED STATES PATENT AND TRADEMARK OFFICE
CERTIFICATE OF CORRECTION

PATENT NO.       : 7,034, 548 B2
APPLICATION NO.  : 10/411806
DATED            : April 25, 2006
INVENTOR(S)      : Keith F. Anderson It is certified that error appears in the above-identified patent and that said Letters Patent is hereby corrected as shown below:

In column 13, line 53, in Claim 2, delete "hybrid-junction" and insert
- - hybrid junction - -, therefor.

Signed and Sealed this

Twenty-second Day of August, 2006

JON W. DUDAS
*Director of the United States Patent and Trademark Office*